United States Patent
Ochi

(10) Patent No.: US 7,285,482 B2
(45) Date of Patent: Oct. 23, 2007

(54) METHOD FOR PRODUCING SOLID-STATE IMAGING DEVICE

(75) Inventor: Mototaka Ochi, Tonami (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 11/029,842

(22) Filed: Jan. 5, 2005

(65) Prior Publication Data

US 2005/0153469 A1 Jul. 14, 2005

(30) Foreign Application Priority Data

Jan. 9, 2004 (JP) ............................. 2004-004538

(51) Int. Cl.
*H01L 21/425* (2006.01)
(52) U.S. Cl. ...................... 438/527; 438/514; 438/582; 438/659; 438/E21.679
(58) Field of Classification Search ............... 438/48, 438/60, 197, 514, 527, 582, 659, 663–664; 257/288
See application file for complete search history.

(56) References Cited

U.S. PATENT DOCUMENTS

| | | | |
|---|---|---|---|
| 6,441,444 B1 | 8/2002 | Tsuji et al. | |
| 6,570,222 B2 * | 5/2003 | Nozaki et al. | 257/347 |
| 6,692,984 B2 | 2/2004 | Yonezawa et al. | |
| 6,855,641 B2 * | 2/2005 | Ryu et al. | 438/767 |
| 2003/0197228 A1 | 10/2003 | Okuda et al. | |
| 2005/0164440 A1 * | 7/2005 | Yaung et al. | 438/197 |

FOREIGN PATENT DOCUMENTS

| | | |
|---|---|---|
| JP | 2000-13370 | 5/2000 |
| JP | 2001-345439 | 12/2001 |
| JP | 2002-270808 | 9/2002 |
| JP | 2002-305296 | 10/2002 |
| JP | 2003-264277 | 9/2003 |

* cited by examiner

*Primary Examiner*—Dung A. Le
(74) *Attorney, Agent, or Firm*—Hamre, Schumann, Mueller & Larson, P.C.

(57) ABSTRACT

A method is provided for producing a solid-state imaging device in which a plurality of pixels are arranged two-dimensionally so as to form a photosensitive region, each of the pixels including a photodiode that photoelectrically converts incident light to store a signal charge and read-out elements for reading out the signal charge from the photodiode, and a vertical driving circuit for driving the plurality of pixels in the photosensitive region in a row direction, a horizontal driving circuit for driving the same in a column direction and an amplify circuit for amplifying an output signal are formed with MOS transistors. The method includes: forming an element isolation region with a STI (Shallow Trench Isolation) structure between the plurality of photodiodes and the plurality of MOS transistors; and forming a gate oxide film of the MOS transistors to have a thickness of 10 nm or less. All of heat treatment processes after formation of gates of the MOS transistors are performed at a temperature range that does not exceed 900° C. In a MOS-type solid-state imaging device having a fine structure, the occurrence of image defects can be suppressed sufficiently.

12 Claims, 6 Drawing Sheets

METHOD FOR PRODUCING SOLID-STATE IMAGING DEVICE

FIELD OF THE INVENTION

The present invention relates to a method for producing a solid-state imaging device that uses an active pixel MOS sensor.

BACKGROUND OF THE INVENTION

A solid-state imaging device using an active pixel MOS sensor has a configuration in which a signal detected by a photodiode in each pixel is amplified by a transistor, and has a high sensitivity. In addition, this solid-state imaging device can be produced by adding a photodiode formation process to a CMOS logic process, and therefore has features of allowing the shortened developing times, low cost and low power consumption.

FIG. 3 shows a circuit configuration of a conventional MOS type solid-state imaging device. In this solid-state imaging device, a plurality of pixels 6 are arranged two-dimensionally so as to constitute a pixel region 7. Each pixel 6 is composed of a unit cell having a photodiode 1; a transfer transistor 2 that transfers a signal of the photodiode; a reset transistor 3 that resets a signal charge; an amplify transistor 4 that amplifies the transferred signal charge and a vertical selection transistor 5 that selects a line from which a signal is to be read. Reference numeral 8 denotes a portion for the connection with a pixel region power supply. At a peripheral circuit region of this pixel region 7, a vertical selection unit 9, a load transistor group 10, a row signal storing unit 11 including a switch transistor and a horizontal selection unit 12 that supplies a column selection signal are arranged.

Vertical selection transistor control lines 13 provided horizontally from the vertical selection unit 9 are each connected with gates of the vertical selection transistors 5 of the corresponding pixels 6, and determine a row from which a signal is to be read. A reset transistor control line 14 is connected with gates of the reset transistors 3. A transfer transistor control line 15 is connected with gates of the transfer transistors 2. A source of the vertical selection transistor 5 is connected with a vertical signal line 16. One end of the vertical signal line 16 is connected with the load transistor group 10 and the other end is connected with the row signal storing unit 11 that includes a switch transistor for capturing a signal corresponding to one row. A signal stored in the row signal storing unit 11 is output successively in accordance with a selection pulse supplied from the horizontal selection unit 12.

When a row selection pulse is applied so as to set a vertical selection transistor control line 13 to a high level, vertical selection transistors 5 in this row only turn ON, thus constituting a source follower circuit with the amplify transistors 4 in the selected row and the load transistor group 10. While the vertical selection transistor control line 13 is at a high level, the corresponding reset transistor control line 14 is set to a high level, whereby a potential of a floating diffusion layer that is connected with a gate region of each of the amplify transistors 4 is reset. Furthermore, while the vertical selection transistor control line 13 is at a high level, the corresponding transfer transistor control line 15 is set to a high level, which allows a signal charge stored in the photodiodes 1 to be transferred to the floating diffusion layer. At this time, the amplify transistors 4 connected to the floating diffusion layer have a gate voltage equal to the potential of the floating diffusion layer, resulting in a voltage that is substantially equal to this gate voltage appearing across the vertical signal line 16, so that the signal is transferred to the row signal storing unit 11 including a switch transistor. Next, the signal in the row signal storing unit 11 is output as an output signal corresponding to one row in accordance with a column selection signal generated successively from the horizontal selection unit 12.

As one example configuring the above-stated MOS type imaging device, JP 2001-345439 A discloses a method for producing a fine CMOS image sensor. FIG. 4 is a cross-sectional view of a MOS type solid-state imaging device disclosed in JP 2001-345439 A. Region A shows a pixel region and region B shows a peripheral circuit region.

On a P-type silicon substrate 20, gate electrodes 23a, 23b and 23c are formed via a gate insulation film (silicon oxide film) 22. Herein, the gate electrode 23a in region A is a read-out gate electrode and the gate electrode 23b is a reset or address gate electrode. Reference numeral 21 denotes an element isolation portion with a Shallow Trench Isolation (STI) structure (hereinafter called STI). The STI structure is used for a finer pattern of 0.25 µm technology or finer.

In region A, a N-type signal storing region 25 of a photodiode and a N-type drain region 24a are formed at a surface region of the silicon substrate 20. In region B, a N-well 26 and a P-well 27 are formed in the silicon substrate 20, and in these N-well 26 and P-well 27, a P-type LDD (Lightly Doped Drain) region 24b and a N-type LDD region 24c respectively are formed.

In such a MOS-type solid-state imaging device, a signal charge stored in the signal storing region 25 of the photodiode is read out to the N-type drain region 24a by applying a positive voltage to the read-out electrode 23a. As a result, a potential of the drain region 24a is modulated. The drain region 24a is electrically connected with the gate electrode 23b of the amplify transistor, so that an amplified electric signal is output to a signal line. In this step, a reset transistor and a reset gate line 23b that are for electrically resetting the drain region 24a, an amplify transistor, an address transistor and an address gate line 23b that are for addressing the amplify transistor are used.

The above-stated conventional solid-state imaging device has the following problems:

(1) Since the MOS-type solid-state imaging device is produced by a method in which a photodiode formation process is added to a CMOS logic process, no specific measures for suppressing image defects (especially typified by white flaws) as one of the properties of a solid-state imaging device are taken.

(2) The production process of the MOS-type solid-state imaging device is based on a CMOS logic process, and therefore this process is tuned so as to realize a favorable basic performance of N-type and P-type transistors. Therefore, if the production process such as a heat treatment is modified, the performance of transistors may deteriorate.

In a fine CMOS logic process, the element isolation is performed with STI, the gate is a dual gate of P-MOS and N-MOS and RTA (Rapid Thermal Anneal) is adopted as the heat treatment. Usually, RTA is carried out at a temperature above 900° C. and up to 1100° C., and may be defined as an anneal carried our for a time period of up to 2 minutes such as a spike anneal carried out in 0.1 second.

According to such a configuration, however, stress due to a rapid temperature change tends to remain, so that it is difficult to suppress image defects when a fine solid-state imaging device is to be manufactured.

SUMMARY OF THE INVENTION

Therefore, with the foregoing in mind, it is an object of the present invention to provide a method for producing a MOS-type solid-state imaging device with a fine structure, by which the generation of image defects can be suppressed sufficiently.

A solid-state imaging device production method according to the present invention is for producing a solid-state imaging device in which a plurality of pixels are arranged two-dimensionally so as to form a photosensitive region. Each of the pixels includes a photodiode that photoelectrically converts incident light to store a signal charge and read-out elements for reading out the signal charge from the photodiode. A vertical driving circuit for driving the plurality of pixels in the photosensitive region in a row direction, a horizontal driving circuit for driving the same in a column direction and an amplify circuit for amplifying an output signal are formed with MOS transistors. The method includes: forming an element isolation region with a STI (Shallow Trench Isolation) structure between the plurality of photodiodes and the plurality of MOS transistors; and forming a gate oxide film of the MOS transistors to have a thickness of 10 nm or less. All of heat treatment processes after formation of gates of the MOS transistors are performed at a temperature range that does not exceed 900° C.

DETAILED DESCRIPTION OF THE INVENTION

According to the thus configured solid-state imaging device production method according to the present invention, various stresses applied to a photodiode can be alleviated and crystal defects can be suppressed. Thereby, in a MOS type solid-state imaging device having a fine structure, the occurrence of image defects can be suppressed sufficiently, and the performance of the device can be improved.

In the solid-state imaging device production method according to the present invention, the heat treatment process may be provided at least after the formation of the photodiodes; after implantation of source and drains; and after implantation of substrate contact. The heat treatment process may be performed using a furnace. Preferably, the heat treatment process using the furnace is performed at a temperature ranging from 850° C. to 900° C., inclusive, and for a time period of up to 60 minutes.

Furthermore, the heat treatment process after the formation of gates of the MOS transistors may include an annealing step at a temperature that does not exceed 900° C. and for 15 minutes or longer. In such a case, preferably, the plurality of MOS transistors are constituted with N-type transistors only.

The following describes embodiments of the present invention more specifically, with reference to the drawings. In each of the drawings referred to in the following description, region A shows a pixel region of a solid-state imaging device and region B shows a peripheral circuit region.

Embodiment 1

A production method according to Embodiment 1 is favorably used for the case where a fine CMOS logic technology of 0.25 µm or finer is used, STI is used as element isolation and a gate oxide film of 10 nm or thinner is produced. A feature of this embodiment resides in that RTA is not used for activation annealing. The production method of a solid-state imaging device according to the present embodiment will be described below, with reference to FIGS. 1A to 1F showing the production process in cross section.

Figure 1A:
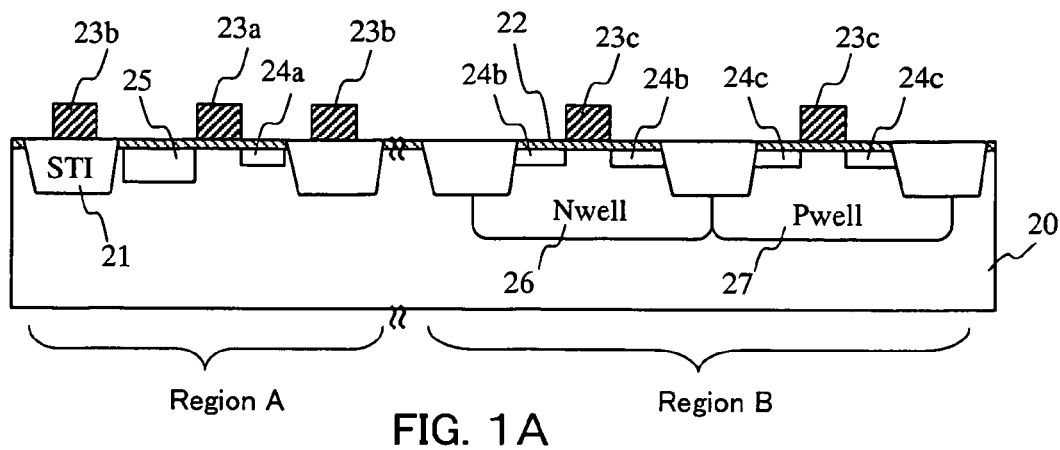
FIGS. 1A to 1F are cross-sectional views showing a production process of a solid-state imaging device according to Embodiment 1 of the present invention.

Firstly, as shown in FIG. 1A, an element isolation region 21 with a STI structure is formed in a P-type silicon substrate 20 using a well-known technology. Next, a signal storing region 25 of a photodiode is formed in region A of the silicon substrate 20. Next, a N-well 26 is formed in a P-MOS transistor formation region in region B, and a P-well 27 is formed in a N-MOS transistor formation region in region B. Typical dopants are phosphorus for the N-well and boron for the P-well. Next, on the silicon substrate 20, a silicon oxide film is formed as a gate insulation film 22. Next, a read-out gate electrode 23a, a reset or address gate electrode 23b and a gate electrode 23c of a MOS field-effect transistor, which are made of polycide (WSi/DPS), are formed.

Next, a N-type drain region 24a is formed at a portion adjacent to the read-out gate electrode 23a in region A and a N-type LDD (Lightly Doped Drain) region 24c is formed in a source/drain region of a N-MOS transistor in region B, which are formed by photolithography and an ion implantation method. Next, a P-type LDD region 24b is formed in a source/drain region of a P-MOS transistor.

Figure 1B:
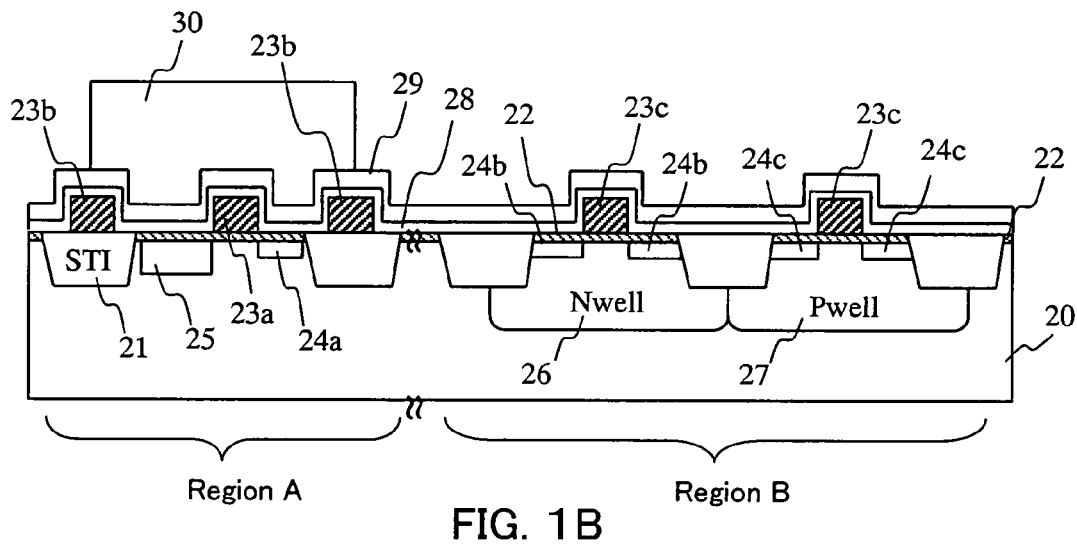

Next, as shown in FIG. 1B, a silicon nitride film 28 is formed to have a film thickness of 30 nm, for example, which is formed on the entire surface using an atmospheric pressure CVD (Chemical Vapor Deposition) method or the like. Furthermore, a silicon oxide film 29 is formed on the silicon nitride film 28 to have a film thickness of 85 nm using a low pressure CVD method or the like. After that, a photoresist film 30 is formed selectively on the silicon oxide film 29 at a region above the photodiode using a photolithography method.

Figure 1C:
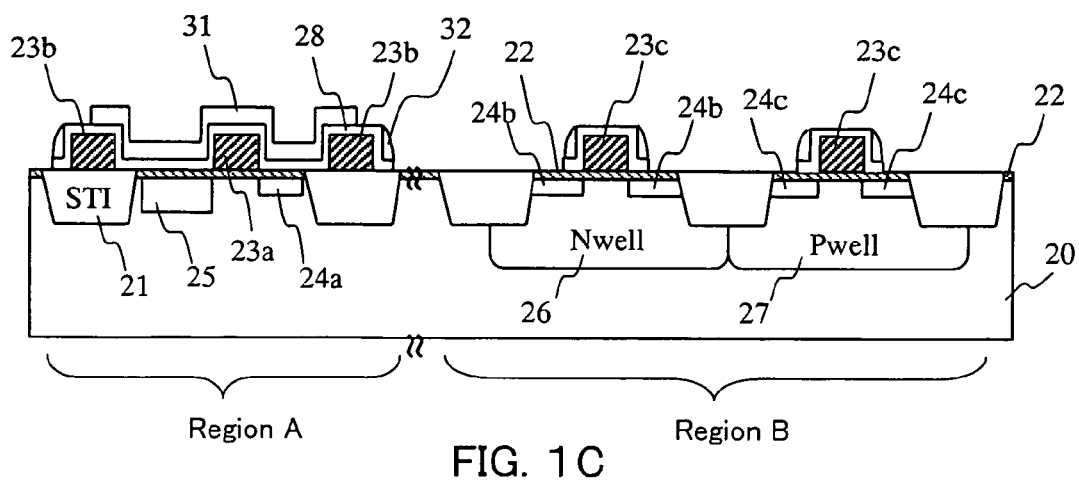

Next, the silicon nitride film 28 and the silicon oxide film 29 are dry-etched using a RIE (Reactive Ion Etching) technique where the photoresist film 30 serves as a mask. As a result, as shown in FIG. 1C, a gate side-wall insulation film 32 is formed on the side walls of the gate electrodes 23a, 23b and 23c, and a silicide block layer 31 is formed over the signal storing region 25 of the photodiode. Thereafter, the photoresist film 30 is removed. In this step, if the polycide is exposed by the dry-etching, this would be a contamination source of W (tungsten) as well as a cause of abnormal oxidation of the surface. Therefore, care should be taken not to expose the polycide.

Figure 1D:
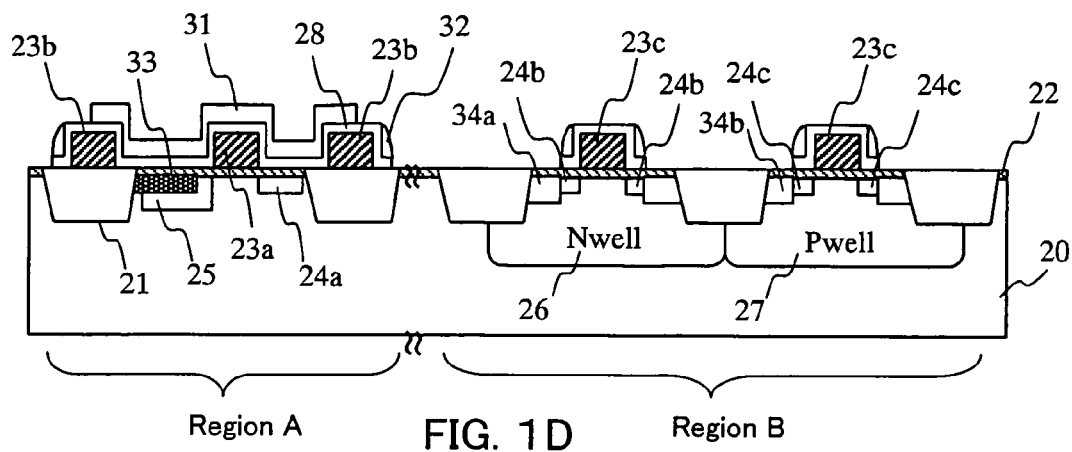

Next, as shown in FIG. 1D, a P+type surface shield region 33 is formed at the surface of the signal storing region 25 using a photolithography method and an ion implantation method. As a result, a P+NP type buried photodiode is formed. Herein the surface shield region 33 enables the shielding of a Si/SiO$_2$ interface located at the surface of the photodiode so as to prevent a depletion layer due to the signal storing region 25 from expanding to the Si/SiO$_2$ interface. Therefore, the surface shield region 33 can suppress the occurrence of a leakage current due to the Si/SiO$_2$ interface state. Meanwhile, in region B, source/drain regions 34a and 34b are formed in the element regions. Herein, N+type ion implantation is performed for the formation of the source/drain region 34a of the N-MOS region and P+type ion implantation is performed for the formation of the source/drain region 34b of the P-MOS region.

Next, activation annealing is conducted with respect to ions implanted in the source/drain regions 34a and 34b. Although RTA is used for this step in a normal CMOS logic process, since RTA requires a rapid temperature rise in a short time, the present embodiment does not use RTA because of the following reasons: the main reasons are three points including: RTA tends to induce crystal defects; RTA does not allow for the alleviation of stress applied to a photodiode from STI and gates; and since the P+type surface shield region 33 is an implantation layer with a considerably high density, a large number of defects may occur, and therefore insufficient annealing would lead to substantial growth of the defects, resulting in the occurrence of secondary defects. For those reasons, in the present embodiment, the activation annealing is conducted using furnace annealing, for example, instead of RTA. According to the furnace annealing, a sufficient heat treatment can be applied by setting a temperature at 850° C. and a time at 45 minutes, for example. In addition, in the case where RTA is used, the activation annealing to the P+type surface shield region 33 is conducted after the formation of the shield region 33. On the other hand, with the furnace annealing, these processes can be conducted at one time.

Next, as a pretreatment for a metal silicide formation, which will be described later, a pre-amorphization ion implantation is conducted. This pre-amorphization ion implantation is conducted in such a manner that As ions are used under the conditions of an acceleration voltage of 20 KeV and a dose of 3.0E14/cm$^2$, for example. Thereafter, a Ti film (not illustrated) having a film thickness of 40 nm, for example, is formed as a silicide metal film on the entire surface using a sputtering method or the like. The silicide metal is not limited to Ti, and refractory metals such as Co, Ni and W may be used.

Figure 1E:
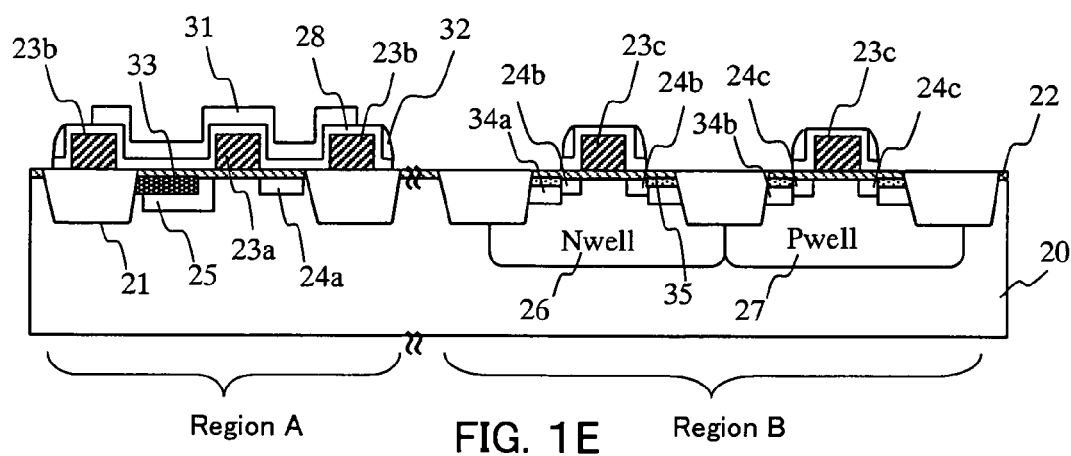

Next, RTP (Rapid Thermal Processing) is conducted in a nitrogen atmosphere under a temperature at 675° C. for 30 seconds, for example. Thereby, as shown in FIG. 1E, silicon in the silicon substrate 20 and Ti in the silicide metal film react at a region where the element regions of the silicon substrate 20 and the silicide metal film directly contact, so that the metal becomes silicide to form a Ti silicide (TiSi) film 35. Thereafter, unreacted silicide metal film is removed using a H$_2$SO$_4$ or a HCl+H$_2$O$_2$ solution, and moreover a RTP heat treatment is performed at a temperature at 850° C. for 10 seconds, for example. In this way, the Ti silicide (TiSi) film 35 can be formed at regions that are not covered with the silicide block layer 31.

Figure 1F:
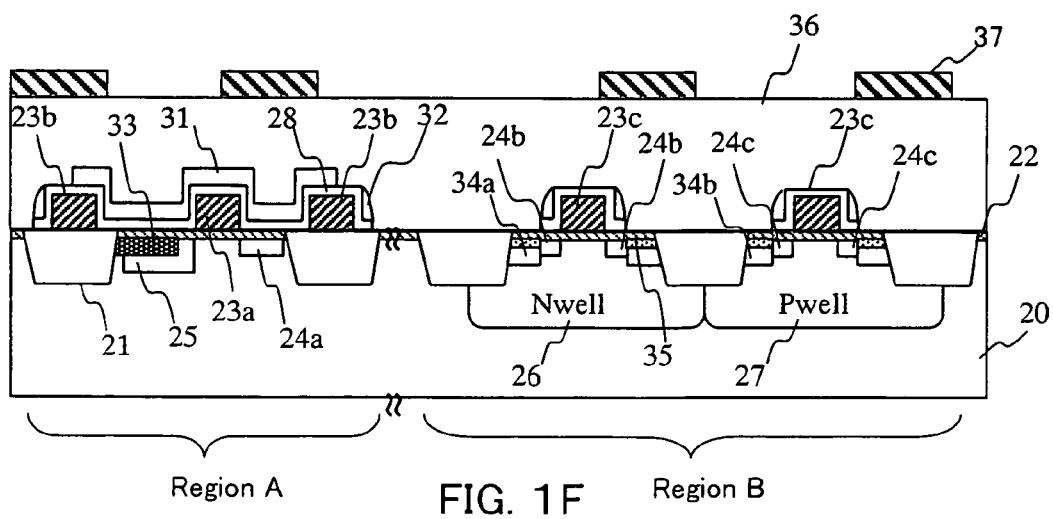

Next, as shown in FIG. 1F, an interlayer insulation film 36 is formed on the entire surface, followed by the planarization of this interlayer insulation film 36 by a CMP (Chemical Mechanical Polish) technology. Al wirings 37 are formed selectively thereon, which serve as signal lines and connecting wirings in region A and connecting wirings in region B. Explanations of the later process for forming a multilayered wiring, which follows known techniques, are omitted.

According to this production method, various stresses applied to a photodiode can be alleviated and crystal defects can be suppressed. Thereby, in a MOS-type solid-state imaging device that is produced using a fine CMOS logic technology of 0.25 μm or finer, defects of imaging properties, such as white flaws and dark graininess, can be solved.

Embodiment 2

A feature of a production method of a solid-state imaging device according to Embodiment 2 resides in that the process of Embodiment 1 is applied to a production process of a solid-state imaging device in which all of the transistors are configured with N-channel transistors (See JP 2002-270808 A, for example). The following describes the present embodiment, with reference to FIGS. 2A to 2F showing the production process in cross section. In the following description, the same steps as in Embodiment 1 are simplified for their explanations, and different steps are explained in detail.

Figure 2A:
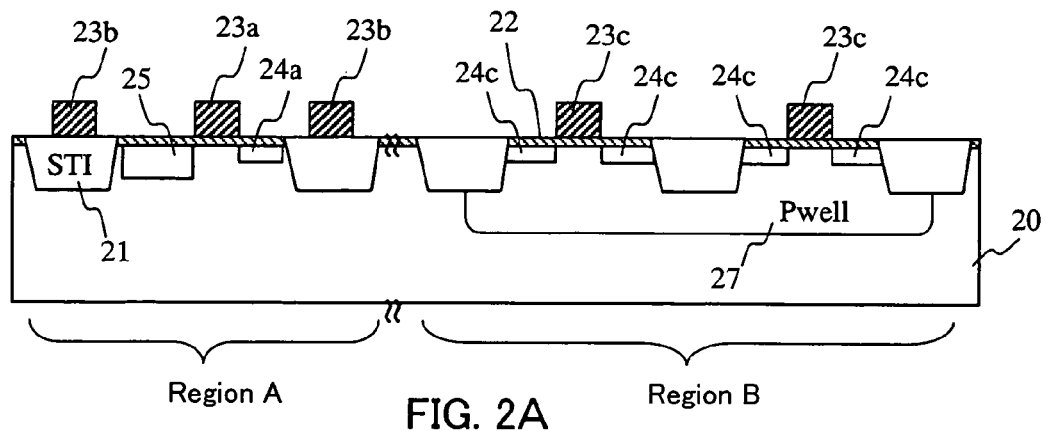
FIGS. 2A to 2F are cross-sectional views showing a production process of a solid-state imaging device according to Embodiment 2 of the present invention.

Firstly, as shown in FIG. 2A, an element isolation region 21 with a STI structure is formed selectively in a P-type silicon substrate 20 using a well-known technology. Next, a signal storing region 25 of a photodiode is formed in region A of the silicon substrate 20. Next, a P-well 27 is formed in a N-MOS transistor formation region in region B. Next, on the silicon substrate 20, a silicon oxide film is formed as a gate insulation film 22. Next, a read-out gate electrode 23a, a reset or address gate electrode 23b and a gate electrode 23c of a MOS field-effect transistor, which are made of polycide (WSi/DPS), are formed.

Next, a N-type drain region 24a is formed at a surface of the silicon substrate 20 at a portion adjacent to the read-out gate electrode 23a in region A and a N-type LDD (Lightly Doped Drain) region 24c is formed in a source/drain region of a N-MOS transistor in region B, which are formed by photolithography and an ion implantation method.

Figure 2B:
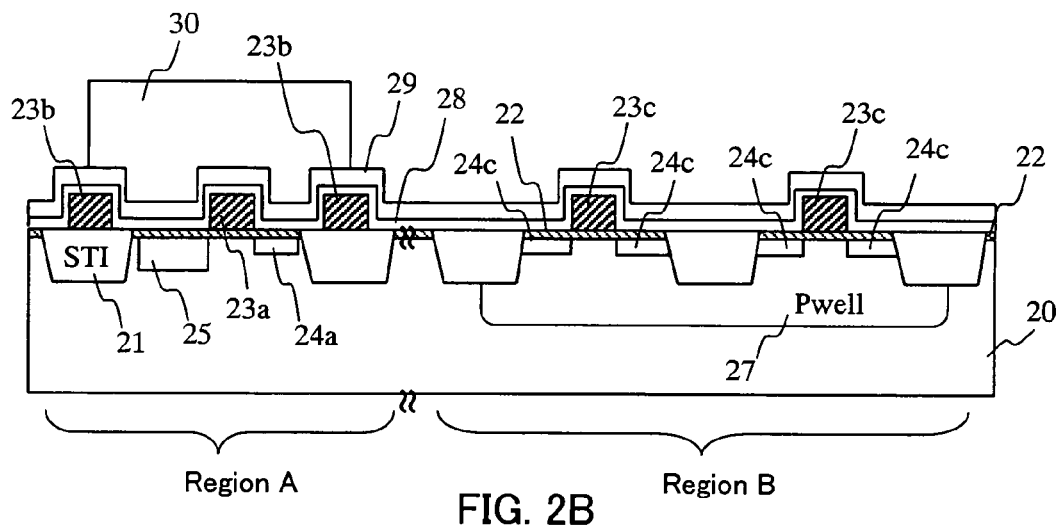

Next, as shown in FIG. 2B, a silicon nitride film 28 is formed to have a film thickness of 30 nm, for example, which is formed on the entire surface using an atmospheric pressure CVD (Chemical Vapor Deposition) method or the like. Furthermore, a silicon oxide film 29 is formed on the silicon nitride film 28 to have a film thickness of 85 nm using a low pressure CVD method or the like. After that, a photoresist film 30 is formed on the silicon oxide film 29 at a region above the photodiode using a photolithography method.

Figure 2C:
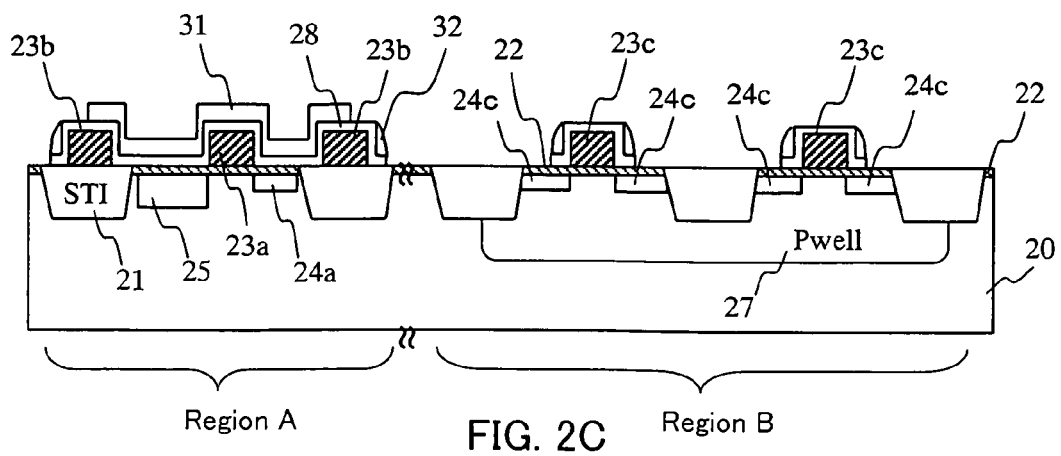

Next, the silicon nitride film 28 and the silicon oxide film 29 are dry-etched using a RIE (Reactive Ion Etching) technique where the photoresist film 30 serve as a mask. Thereby, as shown in FIG. 2C, a gate side-wall insulation film 32 is formed on the side walls of the gate electrodes 23a, 23b and 23c, and a silicide block layer 31 is formed over the signal storing region 25 of the photodiode. Thereafter, the photoresist film 30 is removed. In this step, if the polycide is exposed by the dry-etching, this would be a contamination source of W (tungsten) as well as a cause of abnormal oxidation of the surface. Therefore, care should be taken not to expose the polycide.

Figure 2D:
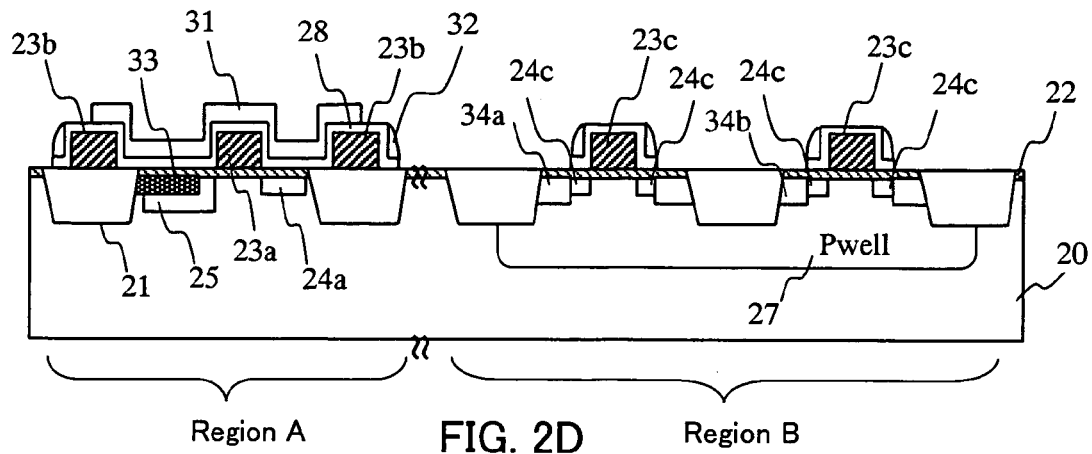

Next, as shown in FIG. 2D, a P+type surface shield region 33 is formed at the surface region of the signal storing region 25 of the photodiode in region A using a photolithography method and an ion implantation method. As a result, a P+NP type buried photodiode is formed. Herein the surface shield region 33 enables the shielding of a Si/SiO$_2$ interface located at the surface of the photodiode so as to prevent a depletion layer due to the signal storing region 25 from expanding to the Si/SiO$_2$ interface. Therefore, the surface shield region 33 can suppress the occurrence of a leakage current due to the Si/SiO$_2$ interface state. Meanwhile, in region B, N+type ion implantation is performed for the formation of a source/drain region 34b in the N-MOS region.

Next, activation annealing is conducted with respect to ions implanted in the source/drain region. Similarly to Embodiment 1, RTA is not used for the activation annealing, and furnace annealing, for example, is used. According to the furnace annealing, a sufficient heat treatment can be applied by setting a temperature at 850° C. and a time at 45 minutes, for example.

Note here that, when the furnace annealing is conducted for the case where P-MOS and N-MOS transistors are both formed, B (boron) might bleed out from a gate of the P-MOS transistor, resulting in a substantial change in a threshold value of the P-MOS transistor. In the case where a solid-state imaging device is constituted with N-MOS transistors only, however, such a problem can be avoided. Even in the case of a N-MOS transistor, transistor characteristics such as a threshold voltage, a saturation current and subthreshold characteristics may fluctuate slightly by the above-stated furnace annealing. Such a fluctuation, however, can be handled by adjustment using ion implantation for threshold value adjustment and source/drain implantation.

Next, as a pretreatment for a metal silicide formation, which will be described later, a pre-amorphization ion implantation is conducted. This pre-amorphization ion implantation is conducted in such a manner that As ions are used under the conditions of an acceleration voltage of 20 KeV and a dose of 3.0E 14/cm$^2$, for example. Thereafter, a Ti film (not illustrated) having a film thickness of 40 nm, for example, is formed as a silicide metal film on the entire surface using a sputtering method or the like. The silicide metal is not limited to Ti, and refractory metals such as Co, Ni and W may be used.

Figure 2E:
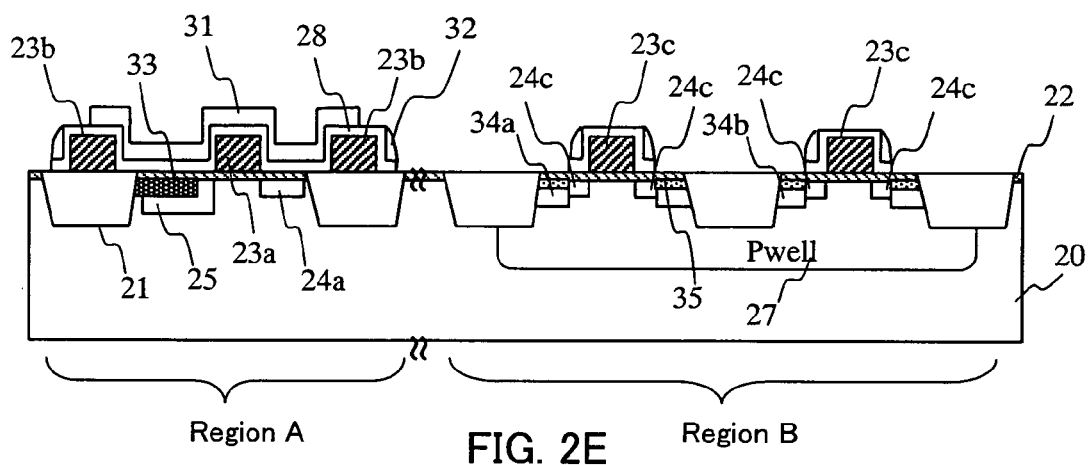

Next, RTP is conducted in a nitrogen atmosphere at a temperature at 675° C. for 30 seconds, for example. Thereby, as shown in FIG. 2E, silicon in the silicon substrate 20 and Ti in the silicide metal film react at a region where the element regions of the silicon substrate 20 and the silicide metal film directly contact, so that the metal becomes silicide to form a Ti silicide (TiSi) film 35. Thereafter, unreacted silicide metal film is removed using a H$_2$SO$_4$ or a HCl+H$_2$O$_2$ solution, and moreover a RTP heat treatment is performed under the conditions of a temperature at 850° C. for 10 seconds, for example. In this way, the Ti silicide (TiSi) film 35 can be formed at regions that are not covered with the silicide block layer 31.

Figure 2F:
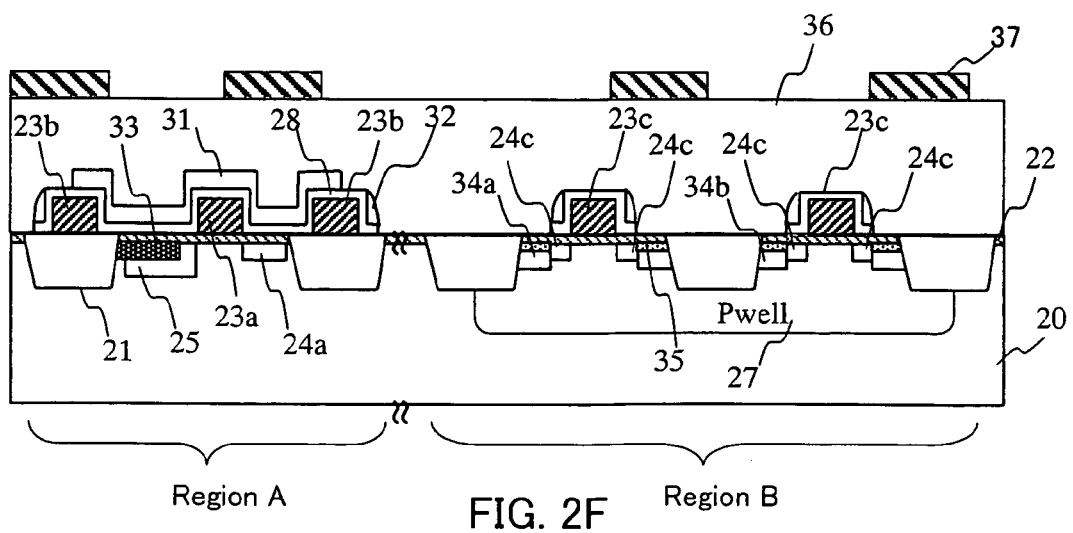
Figure 3:
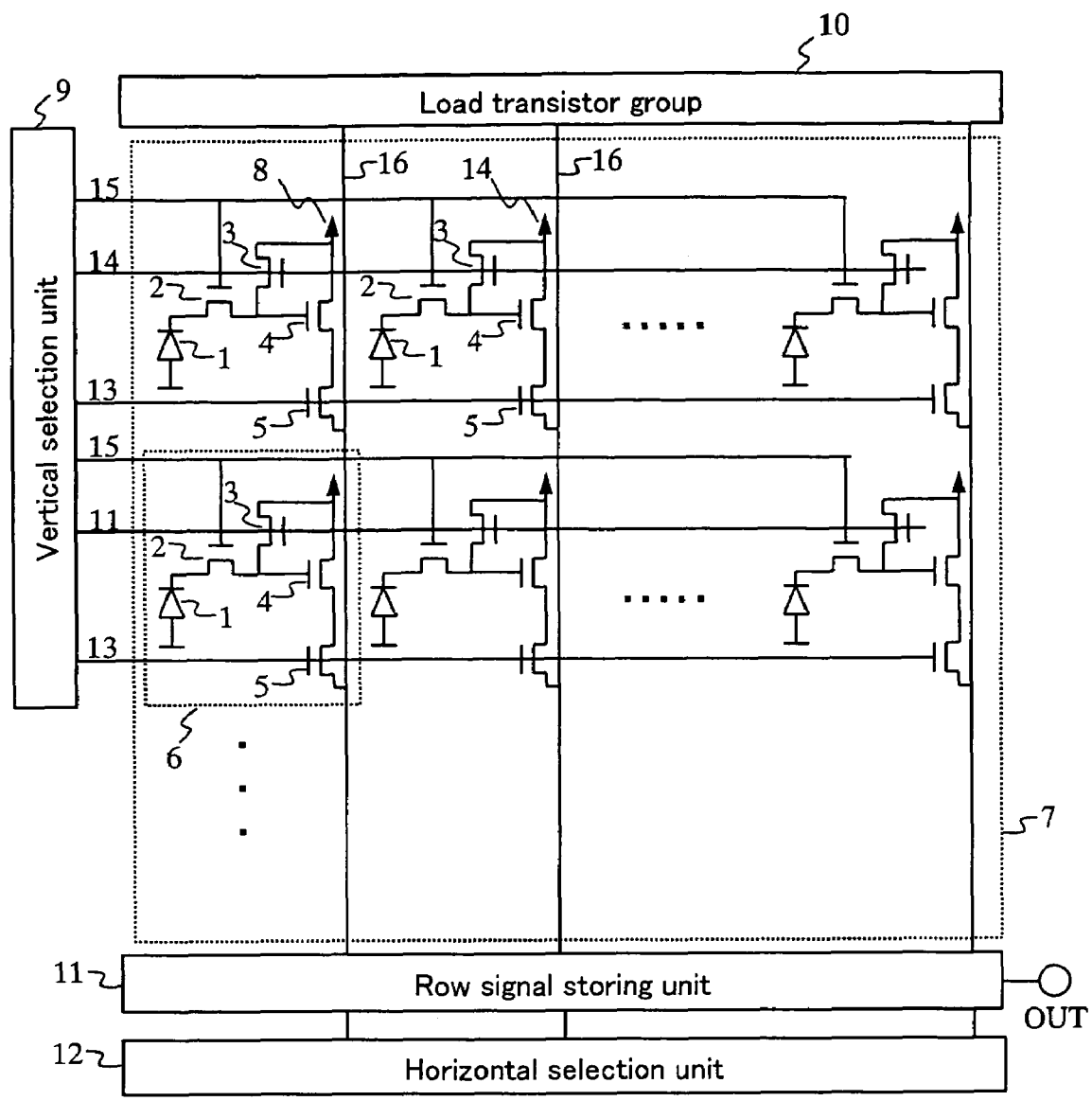
FIG. 3 is a circuit diagram schematically showing a configuration of a solid-state imaging device using an active pixel MOS sensor.
Figure 4:
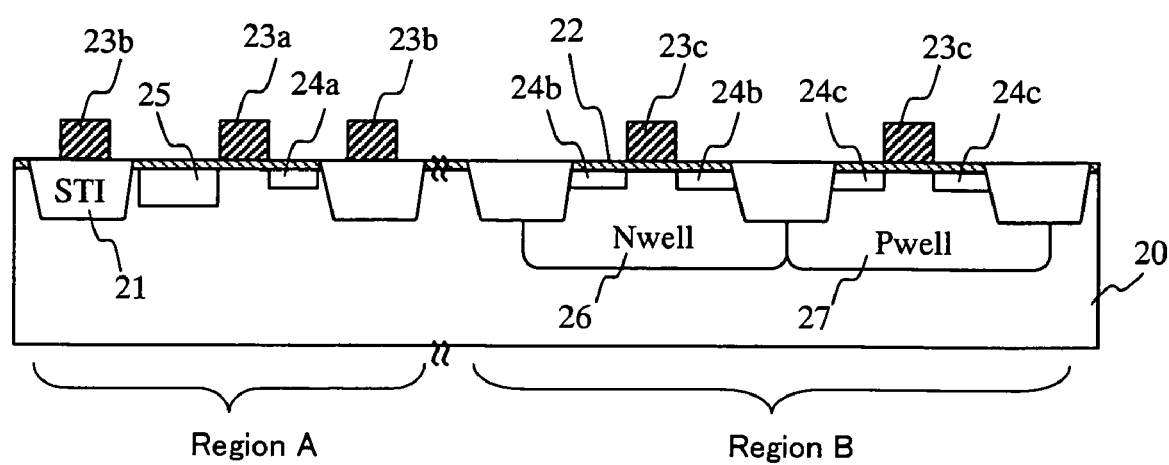
FIG. 4 is a cross-sectional view showing a conventional solid-state imaging device.

Next, as shown in FIG. 2F, an interlayer insulation film 36 is formed on the entire surface, followed by the planarization of this interlayer insulation film 36 by a CMP (Chemical Mechanical Polish) technology. Al wirings 37 are formed selectively thereon, which serve as signal lines and connecting wirings in region A and connecting wirings in region B. Explanations of the later process for forming a multilayered wiring, which follows known techniques, are omitted.

As stated above, according to this embodiment of the present invention, an optimum annealing technology for alleviating various stresses applied to a photodiode and for suppressing crystal defects can be selected while suppressing the degradation of transistor characteristics of both of the P-MOS and N-MOS transistors, especially the degradation of a threshold voltage. Thereby, in a MOS-type solid-state imaging device that is produced using a fine CMOS logic technology of 0.25 μm or finer, defects of imaging properties, such as white flaws and dark graininess, can be solved.

In the above-stated embodiments, polycide (WSi/DPS) is used as the gate electrodes. However, doped polysilicon (DPS) or implanted polysilicon may be used. Furthermore, although Ti silicide is used as the metal silicide, Co, Ni or W silicide may be used. Similar characteristics can be obtained from any one of these metals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a solid-state imaging device in which a plurality of pixels are arranged two-dimensionally so as to form a photosensitive region, each of the pixels including a photodiode that photoelectrically converts incident light to store a signal charge and read-out elements for reading out the signal charge from the photodiode, and a vertical driving circuit for driving the plurality of pixels in the photosensitive region in a row direction, a horizontal driving circuit for driving the same in a column direction and an amplify circuit for amplifying an output signal are formed with metal oxide semiconductor (MOS) transistors, the method comprising:

forming an element isolation region with a STI (Shallow Trench Isolation) structure between the plurality of photodiodes and the plurality of MOS transistors;

forming a gate oxide film of the MOS transistors to have a thickness of 10 nm or less;

implanting ions in source and drain regions of the MOS transistors; and activating the implanted ions with a heat treatment;

wherein all of heat treatment processes after formation of gates of the MOS transistors including a heat treatment process for activating the implanted ions are performed at a temperature range that does not exceed 900° C.

2. The method for producing a solid-state imaging device according to claim 1, wherein the heat treatment process is provided at least after implantation of ions for the formation of the photodiodes; after the implantation of source and drain regions; and after implantation of substrate contact.

3. The method for producing a solid-state imaging device according to claim 2, wherein the heat treatment process after the formation of gates of the MOS transistors includes an annealing step at a temperature that does not exceed 900° C. and for 15 minutes or longer.

4. The method for producing a solid-state imaging device according to claim 2, wherein the plurality of MOS transistors are constituted with N-type transistors only.

5. The method for producing a solid-state imaging device according to claim 1, wherein the heat treatment process for activating implanted ions is performed using a furnace.

6. The method for producing a solid-state imaging device according to claim 5, wherein the heat treatment process for activating implanted ions using the furnace is performed at a temperature ranging from 850° C. to 900° C., inclusive, and for a time period up to 60 minutes.

7. The method for producing a solid-state imaging device according to claim 6, wherein the plurality of MOS transistors are constituted with N-type transistors only.

8. The method for producing a solid-state imaging device according to claim 5, wherein the heat treatment process after the formation of gates of the MOS transistors includes an annealing step at a temperature that does not exceed 900° C. and for 15 minutes or longer.

9. The method for producing a solid-state imaging device according to claim 5, wherein the plurality of MOS transistors are constituted with N-type transistors only.

10. The method for producing a solid-state imaging device according to claim 1, wherein the heat treatment process after the formation of gates of the MOS transistors includes an annealing step at a temperature that does not exceed 900° C. and for 15 minutes or longer.

11. The method for producing a solid-state imaging device according to claim 1, wherein the plurality of MOS transistors are constituted with N-type transistors only.

12. The method for producing a solid state imaging device according to claim 1, wherein the heat treatment for activating the implanted ions is conducted in an annealing furnace for 15 to 60 minutes.

* * * * *